(12) United States Patent
Zolfaghari (10) Patent No.: US 7,271,624 B2
(45) Date of Patent: Sep. 18, 2007

(54) LOW-POWER SUPPLY VOLTAGE LEVEL DETECTION CIRCUIT AND METHOD

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 36 days.

(21) Appl. No.: 11/169,012

(22) Filed: Jun. 29, 2005

(65) Prior Publication Data

US 2007/0001714 A1    Jan. 4, 2007

(51) Int. Cl.
*H03K 5/153* (2006.01)
(52) U.S. Cl. ................. 327/78; 327/79; 327/143; 320/136
(58) Field of Classification Search ............. 327/78, 327/79, 143; 320/136
See application file for complete search history.

(56) References Cited

U.S. PATENT DOCUMENTS

| | | | | | |
|---|---|---|---|---|---|
| 4,902,910 | A | * | 2/1990 | Hsieh | 327/143 |
| 5,130,569 | A | * | 7/1992 | Glica | 327/143 |
| 5,212,412 | A | * | 5/1993 | Atriss et al. | 327/143 |
| 5,319,255 | A | * | 6/1994 | Garverick et al. | 327/143 |
| 5,479,172 | A | * | 12/1995 | Smith et al. | 342/51 |
| 5,497,112 | A | * | 3/1996 | Hoang | 327/143 |
| 5,867,047 | A | * | 2/1999 | Kraus | 327/143 |
| 6,107,847 | A | * | 8/2000 | Johnson et al. | 327/143 |
| 6,229,352 | B1 | * | 5/2001 | Chevallier et al. | 327/77 |
| 6,239,630 | B1 | * | 5/2001 | Bowers et al. | 327/143 |
| 6,288,584 | B1 | * | 9/2001 | Wu et al. | 327/143 |
| 6,346,834 | B1 | * | 2/2002 | Chai | 327/143 |
| 6,388,479 | B1 | * | 5/2002 | Gupta et al. | 327/143 |
| 6,492,848 | B1 | * | 12/2002 | Lee | 327/143 |
| 6,731,143 | B2 | * | 5/2004 | Kim | 327/143 |
| 6,943,592 | B2 | * | 9/2005 | Degoirat et al. | 327/77 |
| 6,972,602 | B2 | * | 12/2005 | Akamatsu et al. | 327/143 |
| 7,046,054 | B2 | * | 5/2006 | Lim | 327/143 |

* cited by examiner

*Primary Examiner*—Kenneth B. Wells
(74) *Attorney, Agent, or Firm*—Sterne, Kessler, Goldstein & Fox P.L.L.C.

(57) ABSTRACT

An input power supply voltage level detection circuit and method are presented. The circuit includes a main detector core and a two-inverter buffer block that can include a first inverter and a second inverter. The circuit receives a voltage input signal and outputs a voltage output signal that is substantially equal to either the voltage input signal or ground, depending on whether the voltage input signal has reached a threshold voltage. The threshold voltage is defined by component characteristics of the main detector core and the two-inverter buffer block. The circuit can receive a hysteresis input signal, tied to the voltage input signal or the ground, that allows the threshold voltage to have a first threshold value when the voltage input signal increases and a second threshold value when the voltage input signal decreases. A power down input signal can also be received that allows the circuit to be powered down.

41 Claims, 8 Drawing Sheets

LOW-POWER SUPPLY VOLTAGE LEVEL DETECTION CIRCUIT AND METHOD

BACKGROUND

1. Field

The present invention is related to power supply voltage level detection and control for use in electronic circuits.

2. Related Art

Previous voltage level detectors consume large amounts of power and current and do not maintain a constant threshold voltage over process and temperature variations. Therefore, what is needed is a low-power, input power supply voltage level detection circuit that maintains a substantially constant threshold voltage over process and temperature variations and keeps current consumption as low as possible.

SUMMARY

An input power supply voltage level detection circuit and method are presented. The circuit includes a main detector core and a two-inverter buffer block that can include a first inverter and a second inverter. The circuit receives a voltage input signal and outputs a voltage output signal that is substantially equal to either the voltage input signal or ground, depending on whether the voltage input signal has reached a threshold voltage. In an example embodiment, the voltage output signal substantially equals the ground when the voltage input signal is below the threshold voltage and substantially equals the voltage input signal otherwise. The threshold voltage is defined by component characteristics of the main detector core and the two-inverter buffer block.

The circuit can receive a hysteresis input signal, tied to the voltage input signal or the ground, that allows the threshold voltage to have a first threshold value when the voltage input signal increases and a second threshold value when the voltage input signal decreases. This prevents erratic fluctuation of the voltage output signal when the voltage input signal hovers just above and just below the threshold voltage.

A power down input signal can also be received by the circuit that allows the circuit to be powered down when the circuit is not needed.

One useful example application of this input power supply voltage level detection circuit is to determine whether a battery used as a power supply can supply sufficient power. Another useful example application of this input power supply voltage level detection circuit is in a power-on-reset (POR) circuit. For example, a power-on-reset of a circuit or system can be conducted if the voltage input signal drops below the threshold voltage as detected by the input power supply voltage level detection circuit. It will be apparent to a person skilled in the pertinent art(s) that this detection circuit can also be employed in a variety of other applications.

An advantage of this input power supply voltage level detection circuit includes keeping the threshold voltage substantially constant over process and temperature variations. Another advantage includes keeping the power consumption of the detection circuit as low as possible, which can be important when current consumption concerns are critical. A further advantage is that a startup circuit is not required.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art(s) to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art(s) will recognize that other configurations and arrangements can be used without departing from the spirit and scope of the present invention. It will be apparent to a person skilled in the pertinent art(s) that this invention can also be employed in a variety of other applications.

Figure 1:
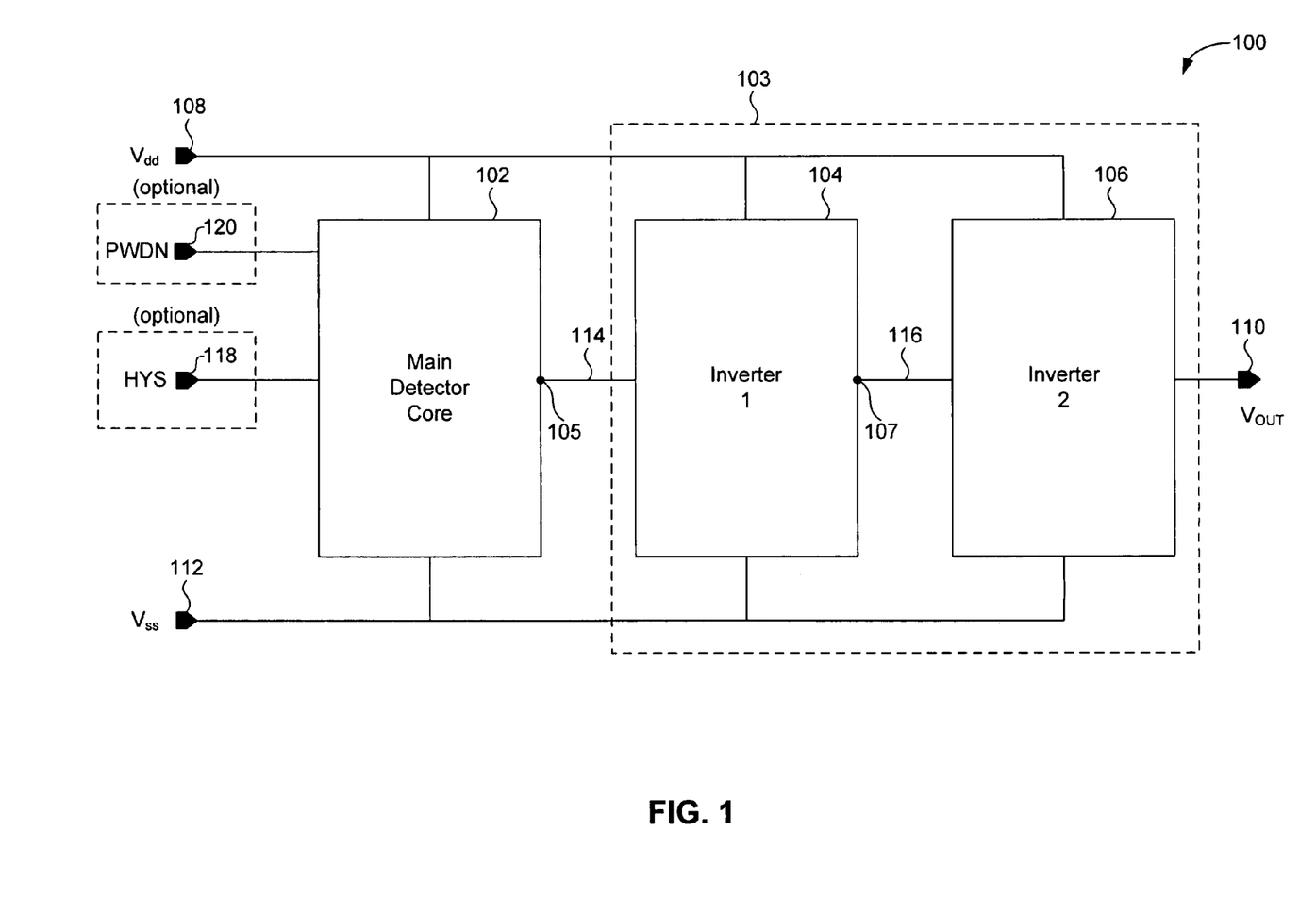
FIG. 1 is a block diagram of an input power supply voltage level detection circuit, according to embodiments of the present invention.

FIG. 1 is a block diagram of an input power supply voltage level detection circuit 100, according to various embodiments of the present invention. Circuit 100 includes a voltage input 108, a ground 112, a main detector core 102 and a two-inverter buffer block 103. Main detector core 102 receives a voltage input signal $V_{dd}$ and a ground signal $V_{ss}$ and outputs a main detector core output signal 114, an analog signal, at main detector core output 105. The two-inverter buffer block 103 receives voltage input signal $V_{dd}$, ground signal $V_{ss}$, and main detector core output signal 114, converts main detector core output signal 114 to a digital signal, and outputs a voltage output signal $V_{OUT}$ at a voltage output 110. Voltage output signal $V_{OUT}$ is substantially equal to voltage input signal $V_{dd}$ or ground signal $V_{ss}$ depending on whether voltage input signal $V_{dd}$ has reached a threshold voltage. The threshold voltage can be defined by the characteristics of components of main detector core 102 and two-inverter buffer block 103.

The two-inverter buffer block 103 can include a first inverter 104 and a second inverter 106. First inverter 104 receives voltage input signal $V_{dd}$, ground signal $V_{ss}$, and main detector core output signal 114 (from main detector core 102), and outputs a first inverter output signal 116 at a first inverter output 107. Second inverter 106 receives voltage input signal $V_{dd}$, ground signal $V_{ss}$ and first inverter output signal 116, and outputs voltage output signal $V_{OUT}$ at voltage output 110. As stated above, voltage output signal $V_{OUT}$ is substantially equal to voltage input signal $V_{dd}$ or ground signal $V_{ss}$ depending on whether voltage input signal $V_{dd}$ has reached a threshold voltage. The threshold voltage can be defined by the characteristics of components of main detector core 102 and first inverter 104.

Input power supply voltage level detection circuit 100 can optionally include a hysteresis input 118 that can provide a hysteresis input signal HYS to main detector core 102. Hysteresis input signal HYS allows the threshold voltage to have a first threshold value when voltage input signal $V_{dd}$ increases and a second threshold value when voltage input signal $V_{dd}$ decreases. This prevents erratic fluctuation of voltage output signal $V_{OUT}$ when voltage input signal $V_{dd}$ hovers just above and just below the threshold voltage. This will be discussed in more detail below with reference to FIG. 4.

Input power supply voltage level detection circuit 100 can optionally include a power down input 120 that can provide a power down input signal PWDN to main detector core 102. Power down input signal PWDN allows input power supply voltage level detection circuit 100 to be powered down when circuit 100 is not needed.

Figure 2:
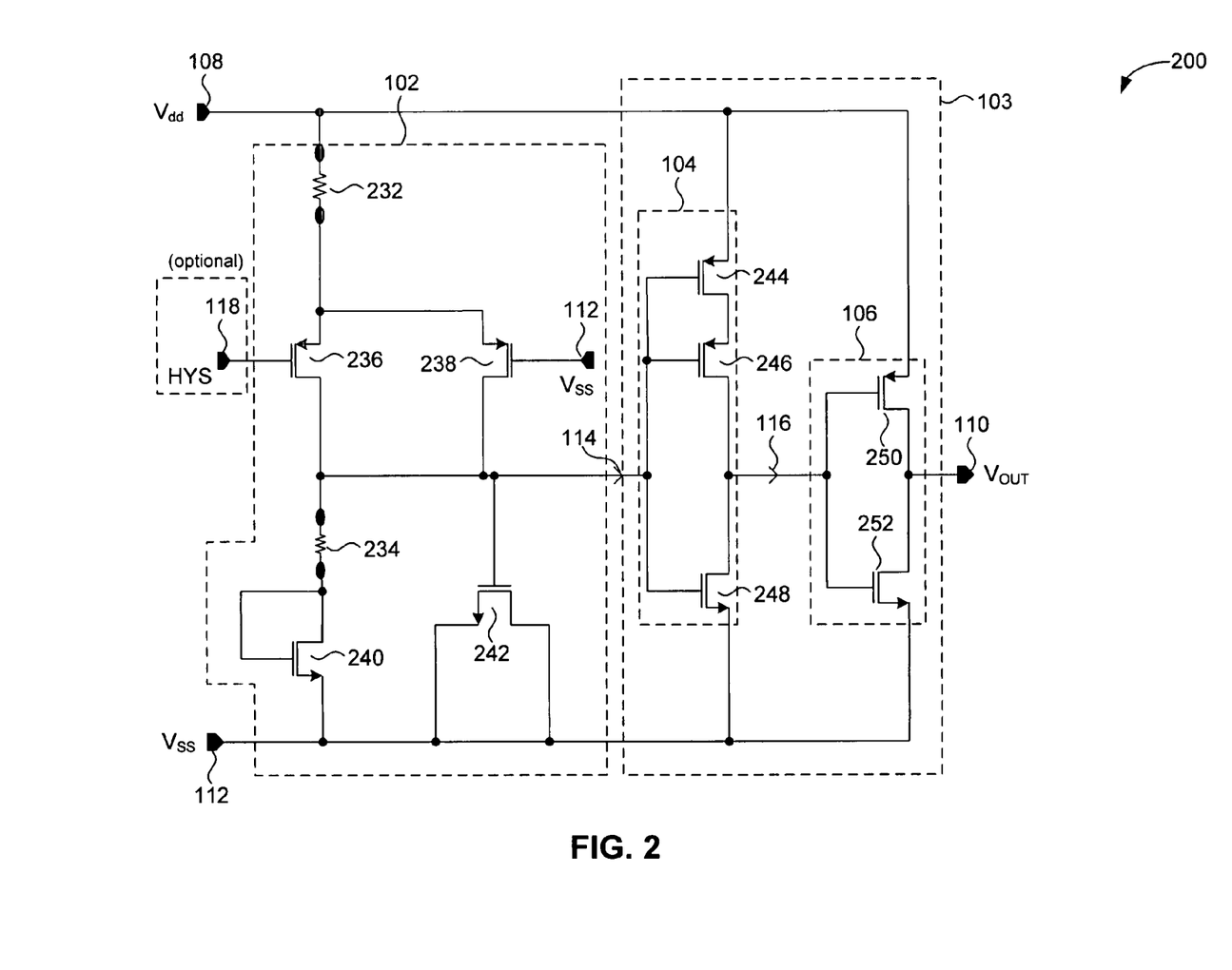
FIG. 2 is a schematic diagram of an input power supply voltage level detection circuit, according to an embodiment of the present invention.

FIG. 2 is a schematic diagram of an input power supply voltage level detection circuit 200, according to an embodiment. Circuit 200 includes voltage input 108, ground 112, optional hysteresis input 118, main detector core 102, and two-inverter buffer block 103 (including first inverter 104 and second inverter 106), as shown in FIG. 1. In FIG. 2, main detector core 102 is shown to include resistors 232 and 234 and transistors 236, 238, 240, and 242. A first end of resistor 232 is coupled to voltage input 108. Transistor 236 includes a source coupled to a second end of resistor 232 and a gate coupled to optional hysteresis input 118. Transistor 238 includes a source coupled to the second end of resistor 232 and a gate coupled to ground 112. A first end of resistor 234 is coupled to drains of transistors 236 and 238 at the location of main detector core output 105 (shown in FIG. 1) that outputs main detector core output signal 114. Transistor 240 includes a drain and gate both coupled to a second end of resistor 234, and a source coupled to ground 112. Transistor 242 includes a source and drain both coupled to ground 112 and a gate coupled to the drains of transistors 236 and 238 (at main detector core output 105). Transistor 242 is used as a capacitor to make the circuit more immune to noise and fast input transitions and spikes. The embodiment shown in FIG. 2 shows transistors 236 and 238 as PMOS transistors and transistors 240 and 242 as NMOS transistors. However, these transistors are not limited to these types of transistors.

First inverter 104 includes transistors 244, 246, and 248. The gates of transistors 244, 246, and 248 are coupled to each other and to the drains of transistors 236 and 238 as well as the gate of transistor 242 (at main detector core output 105). A source of transistor 244 is coupled to voltage input 108. A source of transistor 246 is coupled to a drain of transistor 244. A source of transistor 248 is coupled to ground 112. The drains of transistors 246 and 248 are coupled to each other at the location of first inverter output 107 (shown in FIG. 1), which outputs first inverter output signal 116. The embodiment shown in FIG. 2 shows transistors 244 and 246 as PMOS transistors and transistor 248 as an NMOS transistor. However, these transistors are not limited to these types of transistors.

Second inverter 106 includes transistors 250 and 252. The gates of transistors 250 and 252 are coupled to each other and to the drains of transistors 246 and 248 (at first inverter output 107, shown in FIG. 1). A source of transistor 250 is coupled to voltage input 108. A source of transistor 252 is coupled to ground 112. The drains of transistors 250 and 252 are coupled to each other at the location of voltage output 110, which outputs voltage output signal $V_{OUT}$. The embodiment shown in FIG. 2 shows transistor 250 as a PMOS transistor and transistor 252 as an NMOS transistor. However, these transistors are not limited to these types of transistors.

The threshold voltage obtained by input power supply voltage level detection circuit 200 depends on the component characteristics of main detector core 102 and first inverter 104. For example, the sizing of resistors 232 and 234, the sizing of transistors 236, 238, 240, 244, 246, and 248, and the ratio of transistors 244 and 246 to transistor 248, all play an important role in defining the threshold voltage.

Figure 5:
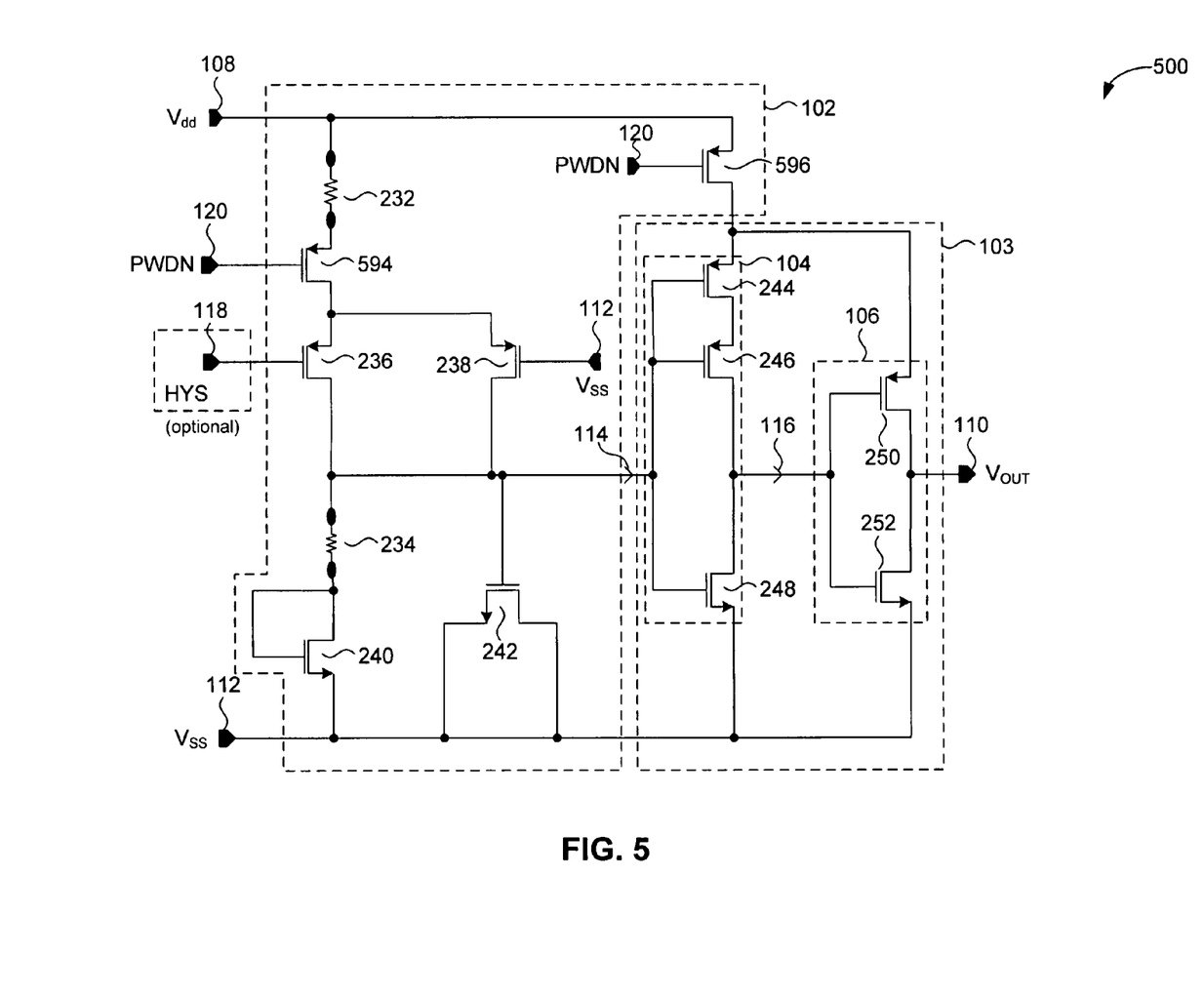
FIG. 5 is a schematic diagram of an input power supply voltage level detection circuit that includes a power down signal input, according to an embodiment of the present invention.

The functionality of circuits 100/200 can be described briefly as follows. Voltage input signal $V_{dd}$ is received at main detector core 102. Main detector core 102 provides main detector core output signal 114, which can be an analog signal, to two-inverter buffer block 103. The two-inverter buffer block 103 converts main detector core output signal 114 to a digital voltage output signal $V_{OUT}$. A threshold voltage is defined by component characteristics of main detector core 102 and two-inverter buffer block 103 (specifically, first inverter 104). The value of voltage output signal $V_{OUT}$ depends on whether voltage input signal $V_{dd}$ has reached the threshold voltage. If voltage input signal $V_{dd}$ has not reached the threshold voltage, then voltage output signal $V_{OUT}$ is substantially equal to ground 112. If voltage input signal $V_{dd}$ has reached the threshold voltage, then voltage output signal $V_{OUT}$ is substantially equal to voltage input signal $V_{dd}$. If optional hysteresis input 118 is used, the threshold voltage can have a first value when voltage input signal $V_{dd}$ increases and a second value when voltage input signal $V_{dd}$ decreases, which is useful in preventing erratic fluctuation of voltage output signal $V_{OUT}$ when voltage input signal $V_{dd}$ hovers just above and just below the threshold voltage. If optional power down input 120 is used (see circuit 100 of FIG. 1), power down input signal PWDN can allow circuit 100 to be powered down when circuit 100 is not needed. For example, if circuit 100 is powered down using power down input signal PWDN, then instead of depending on a threshold voltage, voltage output signal $V_{OUT}$ is a floating (high impedance) voltage output signal. The functionality of circuits 100/200 (and also 500) is further described below.

Figure 3:
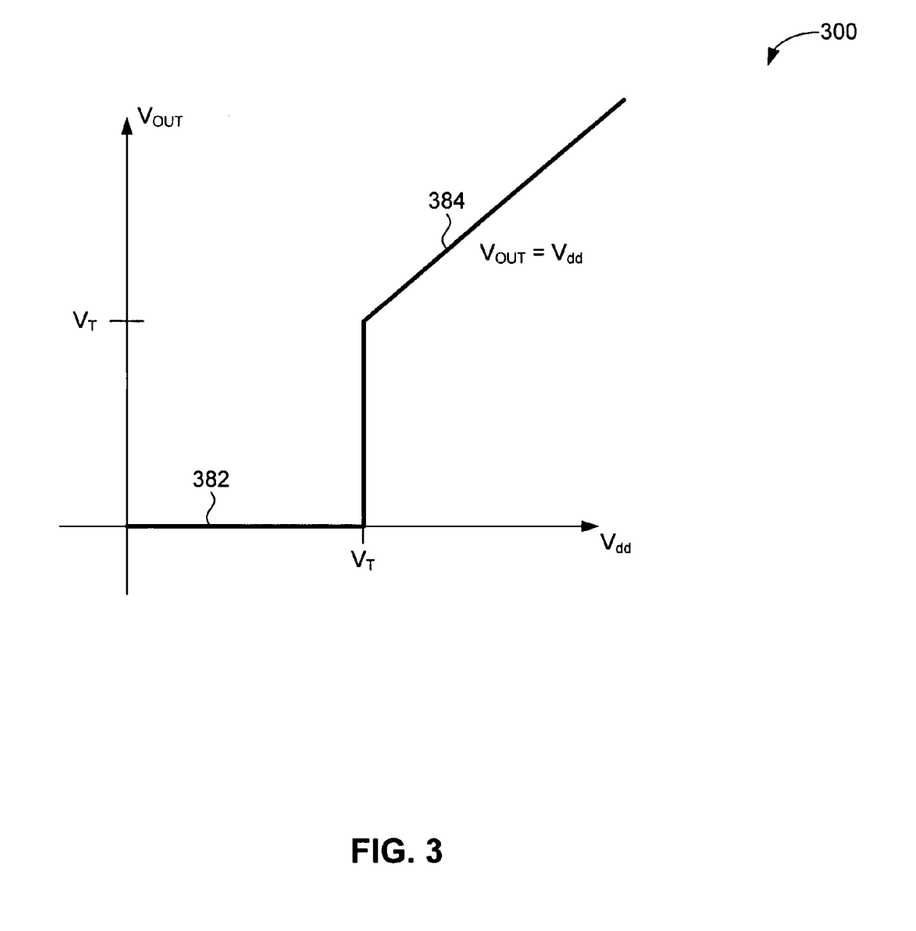
FIG. 3 is a graph showing voltage output signal $V_{OUT}$ versus voltage input signal $V_{dd}$, according to an embodiment of the present invention.

FIG. 3 is a graph 300 showing voltage output signal $V_{OUT}$ versus voltage input signal $V_{dd}$, according to an embodiment. If input power supply voltage level detection circuit 200 is in operation, as voltage input signal $V_{dd}$ increases, voltage output signal $V_{OUT}$ will remain low (e.g., 0 volts) until voltage input signal $V_{dd}$ reaches threshold voltage $V_T$, as shown by line portion 382. Once voltage input signal $V_{dd}$ reaches threshold voltage $V_T$, then voltage output signal $V_{OUT}$ substantially equals $V_{dd}$, as shown by line portion 384. If voltage input signal $V_{dd}$ decreases, the same graph can be followed in the opposite direction if optional hysteresis input 118 is not used. Once voltage input signal $V_{dd}$ decreases to below threshold voltage $V_T$, voltage output signal $V_{OUT}$ will drop back to low (e.g., 0 volts).

If optional hysteresis input 118 is used, the threshold voltage can have a first value when voltage input signal $V_{dd}$ increases and a second value when voltage input signal $V_{dd}$ decreases. Hysteresis input 118 can be tied to voltage input 108 or ground 112. When hysteresis input 118 is tied to ground 112, the value of the voltage threshold is lower than when hysteresis input 118 is tied to voltage input 108. This is because there is a lower resistance over transistors 236/238 when hysteresis input 118 is tied to ground 112 versus when it is tied to voltage input 108.

As stated earlier, using hysteresis input 118 is useful in preventing erratic fluctuation of voltage output signal $V_{OUT}$ when voltage input signal $V_{dd}$ hovers just above and just below the threshold voltage. For example, assume voltage input signal $V_{dd}$ has a nominal value of 3 volts, and that the characteristics of the components of an input power supply voltage level detection circuit are such that the threshold voltage (e.g., $V_T$) is 1.5 volts. If voltage input signal $V_{dd}$ wavers between, for example, 1.6 volts and 1.4 volts, then voltage output signal $V_{OUT}$ will fluctuate between a low voltage value (e.g., 0 volts) and the value of voltage input signal $V_{dd}$. In order to minimize erratic fluctuations of voltage output signal $V_{OUT}$, it is useful to use hysteresis input 118 to provide a second threshold value for when voltage input signal $V_{dd}$ decreases. When hysteresis input 118 is used, the threshold voltage (e.g., $V_T$) can have a value of 1.5 volts, for example, when voltage input signal $V_{dd}$ increases, and can have a value of 1.2 volts, for example, when voltage input signal $V_{dd}$ decreases.

Figure 4:
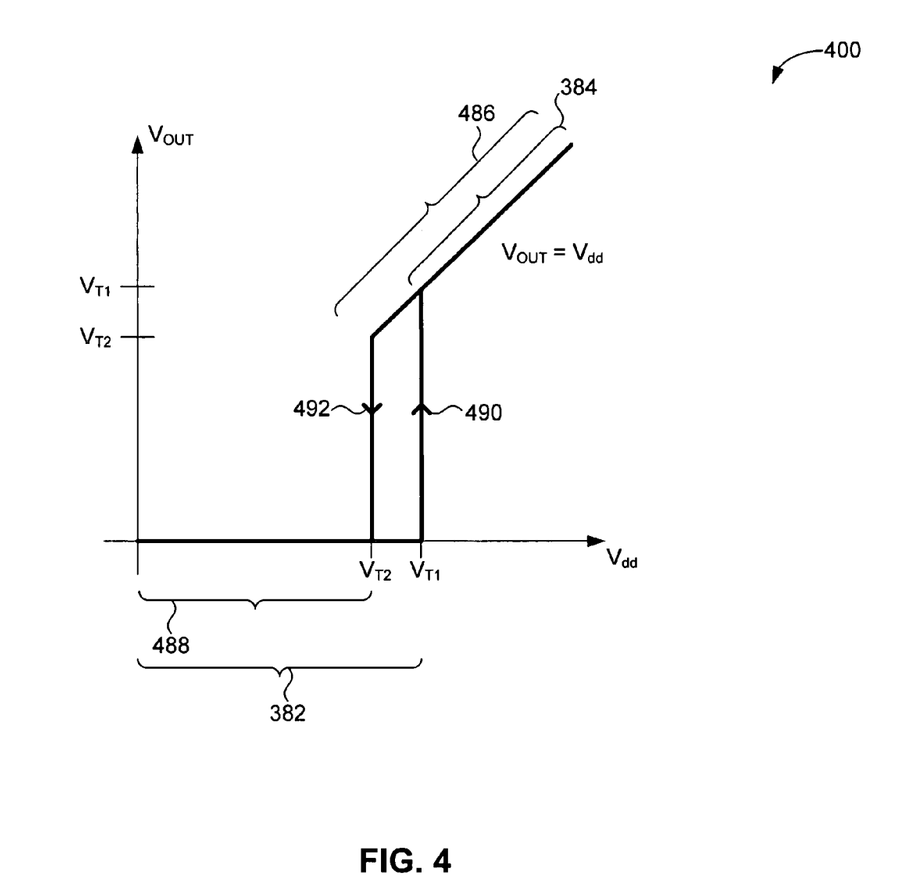
FIG. 4 is a graph showing voltage output signal $V_{OUT}$ versus voltage input signal $V_{dd}$ with two threshold voltages, according to an embodiment of the present invention.

FIG. 4 is a graph 400 depicting the effect of using hysteresis input 118 to define two threshold values. If input power supply voltage level detection circuit 200 is in operation and hysteresis input 118 is used, then as voltage input signal $V_{dd}$ increases, voltage output signal $V_{OUT}$ will remain low (e.g., 0 volts) until voltage input signal $V_{dd}$ reaches threshold voltage $V_{T1}$, as shown by line portion 382 (similar to that shown in graph 300 of FIG. 3). Once voltage input signal $V_{dd}$ reaches threshold voltage $V_{T1}$, then voltage output signal $V_{OUT}$ increases (depicted by arrow 490) to substantially equal $V_{dd}$, as shown by line portion 384 (similar to that shown in graph 300 of FIG. 3). In the alternative, if voltage output signal $V_{OUT}$ substantially equals voltage input signal $V_{dd}$, and voltage input signal $V_{dd}$ is decreasing, $V_{OUT}$ substantially equals voltage input signal $V_{dd}$ until $V_{dd}$ drops below threshold voltage $V_{T2}$, as shown by line portion 486. Once voltage input signal $V_{dd}$ drops below threshold voltage $V_{T2}$, then voltage output signal $V_{OUT}$ decreases (depicted by arrow 492) to low voltage (e.g., 0 volts), as shown by line portion 488.

Using hysteresis input 118 is optional, although there are advantages to using it, as described above. If using an input power supply voltage level detection circuit in a power-on-reset circuit, the hysteresis input 118 would be useful.

FIG. 5 is a schematic diagram of an input power supply voltage level detection circuit 500, according to an embodiment that includes a power down signal input. Circuit 500 is substantially the same as circuit 200 (shown in FIG. 2) but includes power down input 120 (as shown optionally in FIG. 1) that provides power down input signal PWDN to transistors 594 and 596. Transistor 594 is placed between resistor 232 and transistors 236/238 such that a source of transistor 594 is coupled to the second end of resistor 232, a drain of transistor 594 is coupled to the sources of transistors 236 and 238, and a gate of transistor 594 is coupled to power down input 120. Transistor 596 is placed between voltage input 108 and transistor 244 such that a source of transistor 596 is coupled to voltage input 108, a drain of transistor 596 is coupled to the source of transistor 244, and a gate of transistor 596 is coupled to power down input 120. During normal operation of circuit 500, power down input signal PWDN is low. A high power down input signal PWDN can be used to power down circuit 500 when it is not needed, for example, such that voltage output signal $V_{OUT}$ will be a floating (high impedance) voltage output signal. This feature can be used when it is desired to save power. The embodiment shown in FIG. 5 shows transistors 594 and 596 as PMOS transistors. However, these transistors are not limited to this type of transistor.

Figure 6:
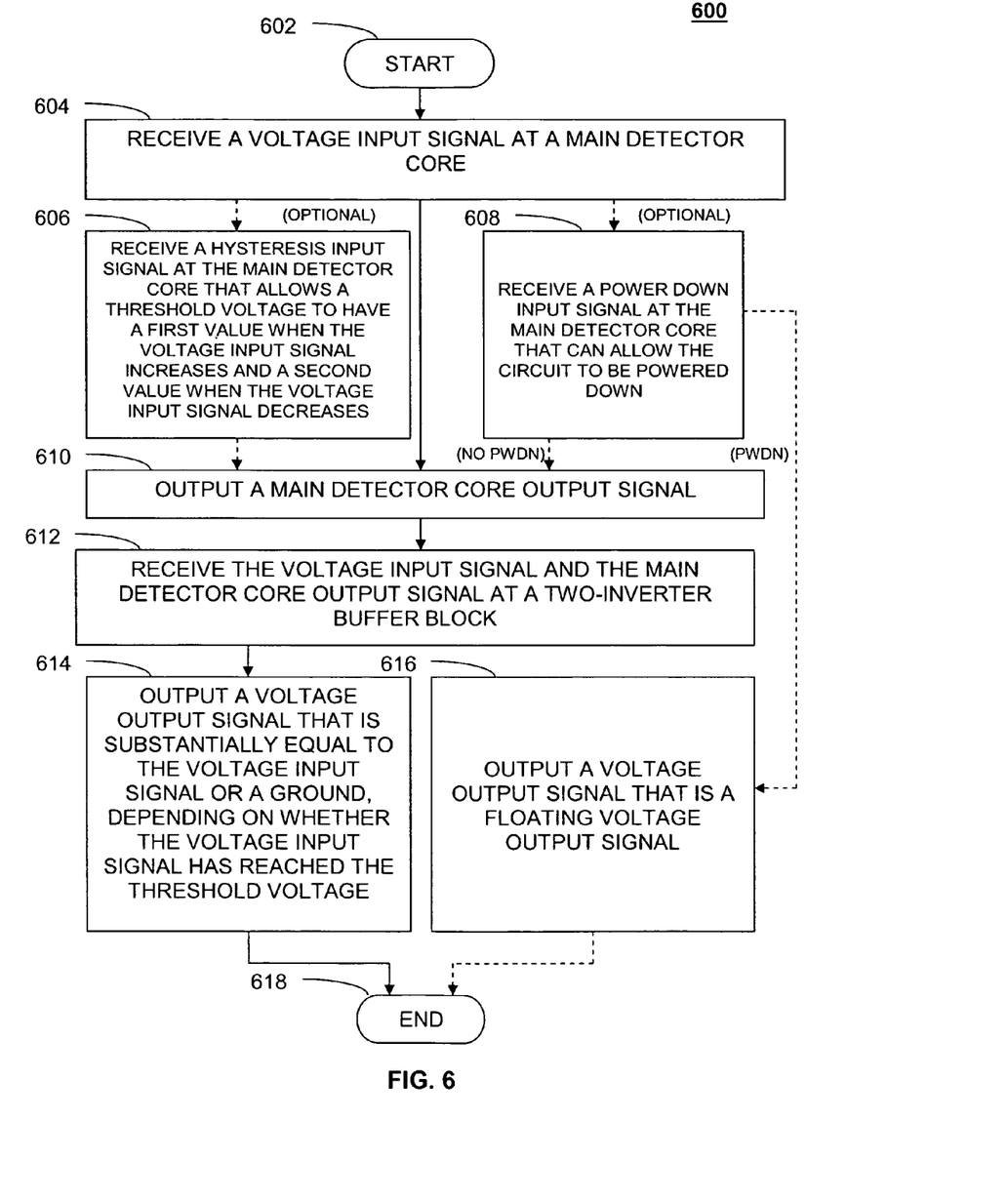
FIG. 6 depicts a method of controlling an input power supply voltage level in a circuit, according to embodiments of the present invention.

A method 600 of controlling an input power supply level in a circuit, according to the above-described embodiments, is shown in FIG. 6. Method 600 starts at step 602 and immediately proceeds to step 604. In step 604, a voltage input signal is received at a main detector core. In step 610, a main detector core output signal is output. The main detector core output signal can be an analog signal. In step 612, the voltage input signal and the main detector core output signal are received at a two-inverter buffer block. Method 600 can include converting the main detector core output signal to a digital signal at the two-inverter buffer block. In step 614, a voltage output signal is output that is substantially equal to the voltage input signal or a ground, depending on whether the voltage input signal has reached a threshold voltage. For example, the voltage output signal is substantially equal to the voltage input signal if the voltage input signal is at or above the threshold voltage, and is substantially equal to ground otherwise. The threshold voltage can be defined by component characteristics of the main detector core and the two-inverter buffer block. Method 600 terminates at step 618.

An optional step 606 includes receiving a hysteresis input signal at the main detector core that allows a threshold voltage to have a first value when the voltage input signal increases and a second value when the voltage input signal decreases. Step 606 is useful in preventing erratic fluctuation of the voltage output signal when the voltage input signal hovers just above and just below the threshold voltage. The hysteresis input signal is tied to either the voltage input signal or ground. The threshold voltage has a higher value when the hysteresis input signal is substantially equal to the voltage input signal than when the hysteresis input signal is substantially equal to ground.

Another optional step 608 includes receiving a power down input signal at the main detector core that can allow the circuit to be powered down. Step 608 can be used to save power when input power supply level control is not needed. For example, when the power down signal does not indicate a power-down (e.g., the power down signal is low), the circuit can operate normally (as described above), and when the power down signal indicates a power-down (e.g., the power down signal is high), the circuit can be "powered down" at step 616 such that the voltage output signal that is output at step 616 is a floating (high impedance) voltage output signal. The method would then terminate at step 618.

Figure 7:
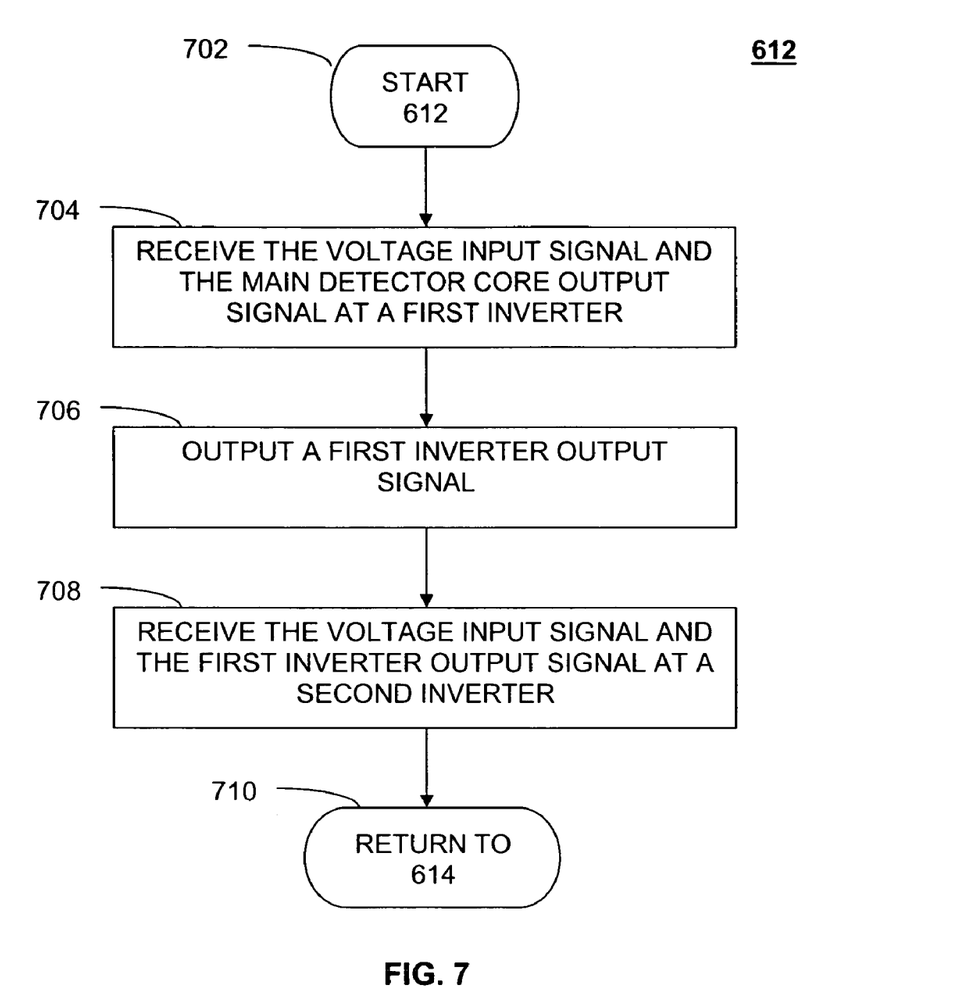
FIG. 7 depicts a method of performing step 612 in FIG. 6, according to an embodiment of the present invention.

Step 612 can include the steps shown in FIG. 7. Step 612 starts with step 702 and immediately proceeds to step 704. In step 704, the voltage input signal and the main detector core output signal are received at a first inverter. In step 706, a first inverter output signal is output. In step 708, the voltage input signal and the first inverter output signal are received at a second inverter. In step 710, the method returns to step 614.

Figure 8:
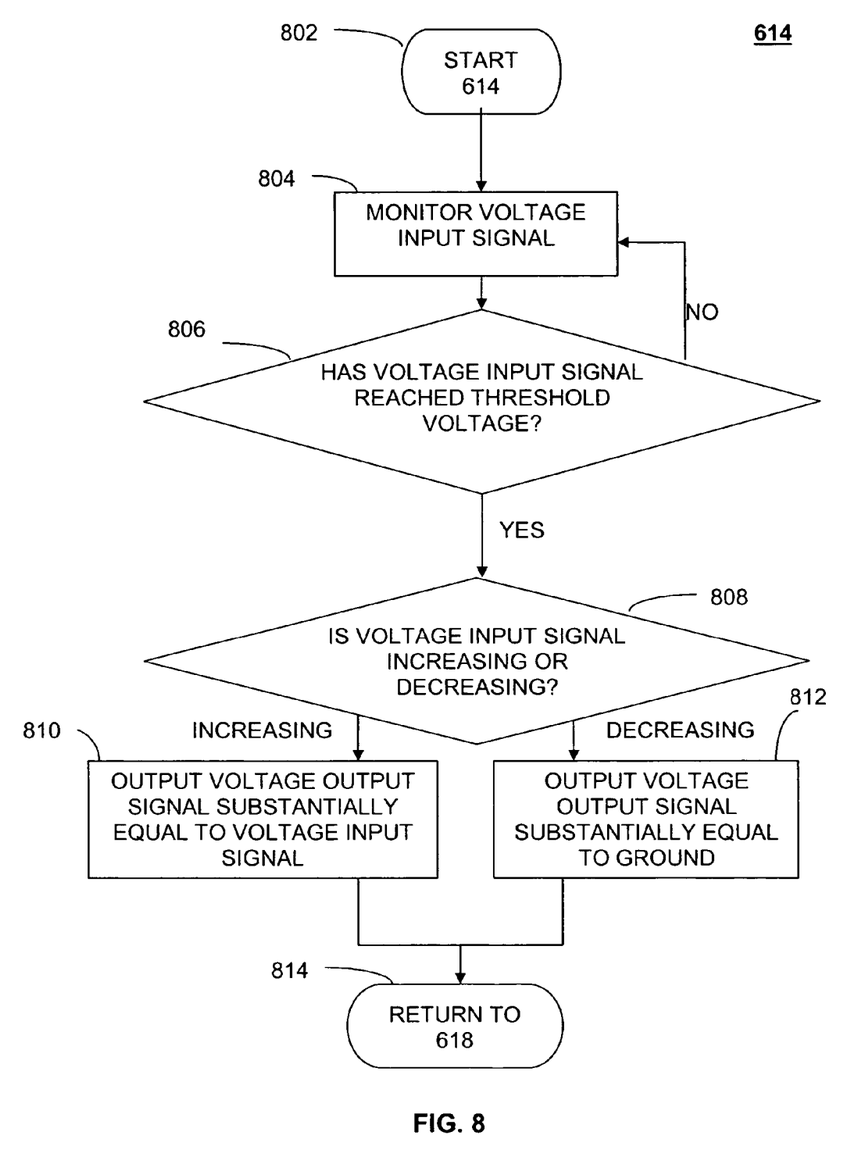
FIG. 8 depicts a method of performing step 614 in FIG. 6, according to an embodiment of the present invention.

Step 614 can include the steps shown in FIG. 8. Step 614 starts with step 802 and immediately proceeds to step 804. In step 804, the voltage input signal is monitored. In step 806, it is determined whether the voltage input signal has reached the threshold voltage. If the voltage input signal has not reached the threshold voltage, the method returns to step 804. If the voltage input signal has reached the threshold voltage, the method proceeds to step 808. In step 808, it is determined whether the voltage input signal is increasing or decreasing. If the voltage input signal is increasing, the method proceeds to step 810. Alternatively, if the voltage input signal is decreasing, the method proceeds to step 812. In step 810, the voltage output signal is output as substantially equal to the voltage input signal, and the method returns to step 618 at step 814. In step 812, the voltage output signal is output as substantially equal to ground, and the method returns to step 618 at step 814.

Method 600 can further conduct a power-on-reset of a circuit or system, where the power-on-reset resets the circuit or system if the voltage input signal drops below the threshold voltage, for example.

The input power supply voltage level detection circuit embodiments described above provide a number of advantages. One advantage is that the circuit keeps the threshold voltage substantially constant over process and temperature variations. Another advantage is that the circuit keeps its power consumption as low as possible, which can be important when current consumption concerns are critical. A further advantage is that a startup circuit is not required.

While various embodiments of the present invention have been described above, it should be understood that they have been presented by way of example only, and not limitation. It will be apparent to persons skilled in the relevant art(s) that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor, and thus, are not intended to limit the present invention and the appended claims in any way.

What is claimed is:

1. An input power supply voltage level detection circuit, comprising:
    a voltage input providing a voltage input signal;
    a ground;
    a main detector core, coupled to the voltage input and to the ground, that receives the voltage input signal and outputs a first output signal at a main detector core output;
    a first inverter, coupled to the voltage input and to the ground, that receives the voltage input signal and the first output signal, and outputs a second output signal at a first inverter output;
    a second inverter, coupled to the voltage input and to the ground, that receives the voltage input signal and the second output signal, and outputs a third output signal at a voltage output that is substantially equal to one of the voltage input signal and the ground, depending on whether the voltage input signal has reached a threshold voltage; and
    a hysteresis input that provides a hysteresis input signal to the main detector core, wherein the hysteresis input is tied to one of the voltage input and the ground, and wherein the threshold voltage has a higher value when the hysteresis input is tied to the voltage input than when the hysteresis input is tied to the ground.

2. The circuit of claim 1, wherein the threshold voltage is defined by component characteristics of the main detector core and component characteristics of the first inverter.

3. The circuit of claim 1, wherein the third output signal substantially equals the ground if the voltage input signal is below the threshold voltage, and substantially equals the voltage input signal otherwise.

4. The circuit of claim 1, wherein the hysteresis input signal allows the threshold voltage to have a first threshold value when the voltage input signal increases and a second threshold value when the voltage input signal decreases.

5. The circuit of claim 1, further comprising a power-on-reset circuit coupled to a system, wherein the power-on-reset circuit resets the system if the voltage input signal drops below the threshold voltage.

6. The circuit of claim 1, further comprising a power down input that provides a power down input signal to the main detector core and that allows the input power supply voltage level detection circuit to be powered down.

7. The circuit of claim 6, wherein the third output signal is a floating voltage output signal when the power down input signal indicates that the input power supply voltage level detection circuit is to be powered down.

8. The circuit of claim 1, wherein the threshold voltage remains substantially constant with respect to process or temperature variation.

9. The circuit of claim 1, wherein the main detector core comprises:
    a first resistor having a first end coupled to the voltage input and a second end;
    a first transistor having a source coupled to the first resistor second end, a gate, and a drain coupled to the main detector core output;
    a second transistor in parallel with the first transistor and having a source coupled to the first transistor source, a gate coupled to the ground, and a drain coupled to the main detector core output;
    a second resistor having a first end coupled to the first and second transistor drains and having a second end;
    a third transistor having a source coupled to the ground, a drain coupled to the second resistor second end, and a gate coupled to the third transistor drain; and
    a fourth transistor having a source and a drain coupled to the ground, and having a gate coupled to the main detector core output.

10. The circuit of claim 9, further comprising a wherein the hysteresis input is located at the first transistor gate and that wherein the hysteresis input signal allows the threshold voltage to have a first threshold value when the voltage input signal increases and a second threshold value when the voltage input signal decreases.

11. The circuit of claim 9, wherein:
    the first transistor is a PMOS transistor;
    the second transistor is a PMOS transistor;
    the third transistor is an NMOS transistor; and
    the fourth transistor is an NMOS transistor.

12. The circuit of claim 9, wherein the first inverter comprises:
   a fifth transistor having a source coupled to the voltage input, a gate coupled to the main detector core output, and a drain;
   a sixth transistor having a source coupled to the fifth transistor drain, a gate coupled to the main detector core output, and a drain coupled to the first inverter output; and
   a seventh transistor having a source coupled to the ground, a gate coupled to the main detector core output, and a drain coupled to the first inverter output.

13. The circuit of claim 12, wherein the threshold voltage is defined by:
   a sizing configuration of
      the first, second, third, fifth, sixth, and seventh transistors, and
      the first and second resistors; and
   a ratio of the fifth and sixth transistors to the seventh transistor.

14. The circuit of claim 12, wherein the second inverter comprises:
   an eighth transistor having a source coupled to the voltage input, a gate coupled to the first inverter output, and a drain coupled to the voltage output; and
   a ninth transistor having a source coupled to the ground, a gate coupled to the first inverter output, and a drain coupled to the voltage output.

15. The circuit of claim 9, further comprising:
   a power down input that provides a power down input signal;
   a fifth transistor placed between the first resistor and the first transistor, having a source coupled to the first resistor second end, a drain coupled to the second and third transistor sources, and a gate coupled to the power down input; and
   a sixth transistor having a source coupled to the voltage input, a drain coupled to the first inverter and the second inverter, and a gate coupled to the power down input,
   wherein the power down input signal allows the input power supply voltage level detection circuit to be powered down.

16. The circuit of claim 15, wherein the fifth and sixth transistors are PMOS transistors.

17. The circuit of claim 15, wherein the first inverter comprises:
   a seventh transistor having a source coupled to the sixth transistor drain, a gate coupled to the main detector core output, and a drain;
   an eighth transistor having a source coupled to the seventh transistor drain, a gate coupled to the main detector core output, and a drain coupled to the first inverter output; and
   a ninth transistor having a source coupled to the ground, a gate coupled to the main detector core output, and a drain coupled to the first inverter output.

18. The circuit of claim 17, wherein the threshold voltage is defined by:
   a sizing configuration of
      the first, second, third, seventh, eighth, and ninth transistors, and
      the first and second resistors; and
   a ratio of the seventh and eighth transistors to the ninth transistor.

19. The circuit of claim 17, wherein the second inverter comprises:
   a tenth transistor having a source coupled to the sixth transistor drain, a gate coupled to the first inverter output, and a drain coupled to the voltage output; and
   an eleventh transistor having a source coupled to the ground, a gate coupled to the first inverter output, and a drain coupled to the voltage output.

20. The circuit of claim 1, wherein the first inverter comprises:
   a first transistor having a source coupled to the voltage input, a gate coupled to the main detector core output, and a drain;
   a second transistor having a source coupled to the first transistor drain, a gate coupled to the main detector core output, and a drain coupled to the first inverter output; and
   a third transistor having a source coupled to the ground, a gate coupled to the main detector core output, and a drain coupled to the first inverter output.

21. The circuit of claim 20, wherein:
   the first transistor is a PMOS transistor;
   the second transistor is a PMOS transistor; and
   the third transistor is an NMOS transistor.

22. The circuit of claim 1, wherein the second inverter comprises:
   a first transistor having a source coupled to the voltage input, a gate coupled to the first inverter output, and a drain coupled to the voltage output; and
   a second transistor having a source coupled to the ground, a gate coupled to the first inverter output, and a drain coupled to the voltage output.

23. The circuit of claim 22, wherein:
   the first transistor is a PMOS transistor; and
   the second transistor is an NMOS transistor.

24. A method of controlling an input power supply voltage level in a circuit, comprising:
   receiving a voltage input signal at a main detector core;
   outputting a main detector core output signal;
   receiving the voltage input signal and the main detector core output signal at a two-inverter buffer block;
   receiving a hysteresis input signal at the main detector core, wherein the hysteresis input signal is substantially equal to one of the voltage input signal and the ground, and wherein the threshold voltage has a higher value when the hysteresis input signal is substantially equal to the voltage input signal than when the hysteresis input signal is substantially equal to the ground: and
   outputting a voltage output signal that is substantially equal to one of the voltage input signal and a ground, depending on whether the voltage input signal has reached the threshold voltage.

25. The method of claim 24, further comprising: converting the main detector core output signal to a digital signal.

26. The method of claim 24, further comprising:
   defining the threshold voltage by component characteristics of the main detector core and component characteristics of the two-inverter buffer block.

27. The method of claim 24, wherein the outputting the voltage output signal step comprises:
   outputting the voltage output signal, wherein the voltage output signal is substantially equal to the voltage input signal if the voltage input signal is at or above the threshold voltage.

28. The method of claim 24, wherein the outputting the voltage output signal step comprises:
   outputting the voltage output signal, wherein the voltage output signal is substantially equal to the ground if the voltage input signal is below the threshold voltage.

29. The method of claim 24, wherein the receiving the voltage input signal and the main detector core output signal at the two-inverter buffer block step comprises:
- receiving the voltage input signal and the main detector core output signal at a first inverter;
- outputting a first inverter output signal; and
- receiving the voltage input signal and the first inverter output signal at a second inverter.

30. The method of claim 24,
- wherein the hysteresis input signal at the main detector core that allows the threshold voltage to have a first threshold value when the voltage input signal increases and a second threshold value when the voltage input signal decreases.

31. The method of claim 24, further comprising:
- conducting a power-on-reset of the circuit, wherein the power-on-reset resets the circuit if the voltage input signal drops below the threshold voltage.

32. The method of claim 24, further comprising:
- receiving a power down input signal at the main detector core; and
- powering down the circuit in response to the power down input signal.

33. The method of claim 32, wherein the outputting the voltage output signal step comprises:
- outputting the voltage output signal, wherein the voltage output signal is a floating voltage output signal if the power down input signal indicates that the circuit is to be powered down.

34. An input power supply voltage level detection circuit, comprising:
- a voltage input providing a voltage input signal;
- a ground;
- a main detector core, coupled to the voltage input and to the ground, that receives the voltage input signal and outputs a main detector core output signal at a main detector core output;
- a two-inverter buffer block, coupled to the voltage input and to the ground, that receives the voltage input signal and the main detector core output signal, and outputs a voltage output signal at a voltage output that is substantially equal to one of the voltage input signal and the ground, depending on whether the voltage input signal has reached a threshold voltage; and
- a hysteresis input that provides a hysteresis input signal to the main detector core, wherein the hysteresis input is tied to one of the voltage input and the ground, and wherein the threshold voltage has a higher value when the hysteresis input is tied to the voltage input than when the hysteresis input is tied to the ground.

35. The circuit of claim 34, wherein the two-inverter buffer block converts the main detector core output signal to a digital signal.

36. The circuit of claim 34, wherein the threshold voltage is defined by component characteristics of the main detector core and component characteristics of the two-inverter buffer block.

37. The circuit of claim 34, wherein the voltage output signal substantially equals the ground if the voltage input signal is below the threshold voltage, and substantially equals the voltage input signal otherwise.

38. The circuit of claim 34, wherein the hysteresis input signal that allows the threshold voltage to have a first threshold value when the voltage input signal increases and a second threshold value when the voltage input signal decreases.

39. The circuit of claim 34, further comprising a power-on-reset circuit coupled to a system, wherein the power-on-reset circuit resets the system if the voltage input signal drops below the threshold voltage.

40. The circuit of claim 34, further comprising a power down input that provides a power down input signal to the main detector core and that allows the input power supply voltage level detection circuit to be powered down.

41. The circuit of claim 40, wherein the voltage output signal is a floating voltage output signal when the power down input signal indicates that the input power supply voltage level detection circuit is to be powered down.

* * * * *

UNITED STATES PATENT AND TRADEMARK OFFICE
CERTIFICATE OF CORRECTION

PATENT NO. : 7,271,624 B2 Page 1 of 1
APPLICATION NO. : 11/169012
DATED : September 18, 2007
INVENTOR(S) : Alireza Zolfaghari It is certified that error appears in the above-identified patent and that said Letters Patent is hereby corrected as shown below:

Claim 10, Column 8, Line 57 - Please replace "The circuit of claim 9, further comprising a wherein" with --The circuit of claim 9, wherein--;

Claim 10, Column 8, Line 59 - Please replace "that wherein the hysteresis input signal allows the threshold" with --wherein the hysteresis input signal allows the threshold--;

Claim 24, Column 10, Line 43 - Please replace "the threshold voltage" with --a threshold voltage--;

Claim 30, Column 11, Lines 10-11 - Please replace "wherein the hysteresis input signal at the main detector core that allows the threshold voltage to have a first" with --wherein the hysteresis input signal allows the threshold voltage to have a first--; and Claim 38, Column 12, Line 23 - Please replace "signal that allows the threshold voltage to have a first" with --signal allows the threshold voltage to have a first--.

Signed and Sealed this

Thirteenth Day of May, 2008

JON W. DUDAS
*Director of the United States Patent and Trademark Office*